(12) United States Patent
Schulte et al.

(10) Patent No.: US 6,567,251 B1
(45) Date of Patent: *May 20, 2003

(54) ELECTROSTATIC DISCHARGE PROTECTION OF ELECTRICALLY-INACTIVE COMPONENTS

(75) Inventors: Donald W. Schulte, Corvallis, OR (US); Robert W. Shreeve, Corvallis, OR (US)

(73) Assignee: Hewlett-Packard Development Company, Houston, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/385,309

(22) Filed: Aug. 30, 1999

(51) Int. Cl.[7] ............................ H01H 47/00; H02H 9/00

(52) U.S. Cl. ............................ 361/56; 361/220; 347/64; 257/173

(58) Field of Search ............................ 347/50, 58, 59, 347/63, 64; 361/56, 111, 58, 212–214, 220; 257/173

(56) References Cited

U.S. PATENT DOCUMENTS

| | | | | |
|---|---|---|---|---|
| 5,635,968 A | * | 6/1997 | Bhaskar et al. | 347/59 |
| 6,002,569 A | * | 12/1999 | Horvath | 361/111 |
| 6,361,150 B1 | * | 3/2002 | Schulte et al. | 347/56 |

* cited by examiner

Primary Examiner—Kim Huynh

(57) ABSTRACT

This present invention is embodied in a system and a method for protecting an electrically-inactive component of a microsystem from an ESD event. The invention includes embodiments that protect the microsystem from ESD events that directly strike an electrically-inactive component and that are external to the electrically-inactive component. These embodiments include an ESD dissipation device having a connected chain of electrically-inactive components that are electrically floating as well as embodiments whereby the electrically-inactive components are held at the same potential as an electrical component. Furthermore, these embodiments include a sacrificial ESD breakdown device that provides a preferential ESD breakdown site away from the protected component and embodiments that provide a capacitively coupled thin-film layers that provide shielding to an electrically-inactive component.

24 Claims, 10 Drawing Sheets

ELECTROSTATIC DISCHARGE PROTECTION OF ELECTRICALLY-INACTIVE COMPONENTS

FIELD OF THE INVENTION

The present invention generally relates to electrostatic discharge protection (ESD) systems and more particularly to a system and a method for protecting an electrically-inactive component of a microsystem from an ESD event.

BACKGROUND OF THE INVENTION

Electrostatic discharge (ESD) events are potentially serious occurrences that can cause major damage to microsystems such as intergrated circuits (ICs) and microelectromechanical systems (MEMS or, more simply, micromachines). A typical ESD event is usually a high voltage occurrence and can easily damage or destroy a microsystem, which is designed to operate at small voltages.

Microsystems typically contain both electrically-active (or electrical) components (such as, for example, resistors and capacitors) and electrically-inactive components (such as cantilevered beams, gears and thin-film layers) that have a primarily non-electrical or mechanical function. Microsystems are vulnerable to ESD events because of their small size and an ESD event can easily damage or destroy the components contained within the microsystem. Further, damage can occur not only to the electrical components of the microsystem, but also to the electrically-inactive components of the microsystem.

Although many microsystems contain ESD protection systems, current ESD protection schemes are designed to protect only the electrical components of the microsystem. Hence, the electrically-inactive components are generally left unprotected from potentially damaging ESD events. This is a problem because, even if the electrical components have ESD protection, an ESD event still can cause damage to the electrical components of the microsystem, especially if the electrically-inactive component is in close proximity to the electrical component. Therefore, there exists a need for an ESD protection system that provides protection from ESD events for not only electrical components of a microsystem, but also the electrically-inactive components.

SUMMARY OF THE INVENTION

To overcome the limitations in the prior art described above, and to overcome other limitations that will become apparent upon reading and understanding the present specification, the present invention is embodied in a novel system and method for protecting a microsystem from electrostatic discharge (ESD) by protecting an electrically-inactive component of the microsystem. By providing ESD protection to the electrically-inactive component, a more complete and efficient ESD protection system is achieved that also provides additional protection for any sensitive electrical components of the microsystem. The present invention may be used in microsystems (such as integrated circuits and micromachines) that contain electrically-inactive components. Electrically-inactive components include those components of the microsystem that have no electrical function and those structures (for example gears, thin-film layers and cantilevered beams) that have a primarily mechanical purpose.

The present invention is provides highly effective and efficient ESD protection to Microsystems having electrically-inactive components. In particular, by providing ESD protection to the electrically-inactive components of the microsystem as well as the electrical components the present invention greatly reduces the sensitivity of a microsystem to ESD events. Moreover, the present invention may be implemented easily within a microsystem using existing structure and circuitry or by microfabrication techniques that are well-known in the art.

The system of the present invention includes an ESD protection system that is positioned to direct an ESD event away from an electrically-inactive component of a microsystem. The ESD protection system of the present invention is designed either to reduce the damaging effects of an ESD event or prevent the ESD event from occurring. The present invention includes several embodiments of the ESD protection system that are used to accomplish these purposes.

In particular, one embodiment the ESD protection system provides an electrically floating large conductive area for disipatiion of an ESD event. This large conductive area, which is capacitively coupled to an electrically-inactive component, reduces the susceptibility of the electrically-inactive component by providing a storage area for the ESD event. In another embodiment, the large conductive area and the electrically-inactive component are kept at the same potential or ground, thereby greatly reducing the occurrence of an ESD event. Furthermore, in order to provide ESD protection during a manufacturing process, the embodiment may include a severable link (such as a fuse) so that the electrically-inactive component and the large conductive area are kept at the same potential for a certain period of time before the connection between the large conductive area and the potential is severed. In this way, the ESD protection system greatly reduces the occurrence of an ESD event during the manufacturing process without affecting the normal operation of the microsystem.

Another embodiment of the present invention includes an ESD protection system that provides a preferred breakdown location for an ESD event at a location away from any electrically-inactive components. In this way, even if all other ESD protection systems fail the resulting damage to the microsystem will be in a location that does not affect the microsystem operation. Other embodiments of the present invention include various ESD protection system designs that divide the large conductive area within the microsystem into various planes. The charge from an ESD event is store in these various planes thereby avoiding the creation of a high charge area in a plane that could damage the plane. Furthermore, a shunt bar is introduced in several designs to provide an ESD event with a preferred path to flow, this preferred path being away from the electrically-inactive component. The present invention also includes a method of protecting a microsystem having an electrically-inactive component using the aforementioned systems.

Other aspects and advantages of the present invention as well as a more complete understanding thereof will become apparent from the following detailed description, taken in conjunction with the accompanying drawings, illustrating by way of example the principles of the invention. Moreover, it is intended that the scope of the invention be limited by the claims and not by the preceding summary or the following detailed description.

BRIEF DESCRIPTION OF THE DRAWINGS

The present invention can be further understood by reference to the following description and attached drawings that illustrate the preferred embodiment. Other features and advantages will be apparent from the following detailed description of the preferred embodiment, taken in conjunction with the accompanying drawings, which illustrate, by way of example, the principles of the invention.

Referring now to the drawings in which like reference numbers represent corresponding parts throughout.

DETAILED DESCRIPTION OF THE INVENTION

In the following description of the invention, reference is made to the accompanying drawings, which form a part hereof, and in which is shown by way of illustration a specific example in which the invention may be practiced. It is to be understood that other embodiments may be utilized and structural changes may be made without departing from the scope of the present invention.

I. General Overview

The present invention provides a microsystem with ESD protection from both direct ESD events and external ESD events. In general, a direct ESD event is one that directly strikes (or in close proximity to) an electrically-inactive component. An external ESD event is one that occurs away from an electrically-inactive component. Although an external ESD event occurs away from electrically-inactive components, it can damage the component because a conductive path usually exists from the strike area to the component. For example, although a resistor may be located deep within the components, of a thermal ink jet printhead, it can be damaged if an ESD event strikes a trace on the surface of the printhead. The present invention provides protection to microsystems from both of the above types of ESD events.

A. ESD Protection from a Direct ESD Event

Figure 1A:
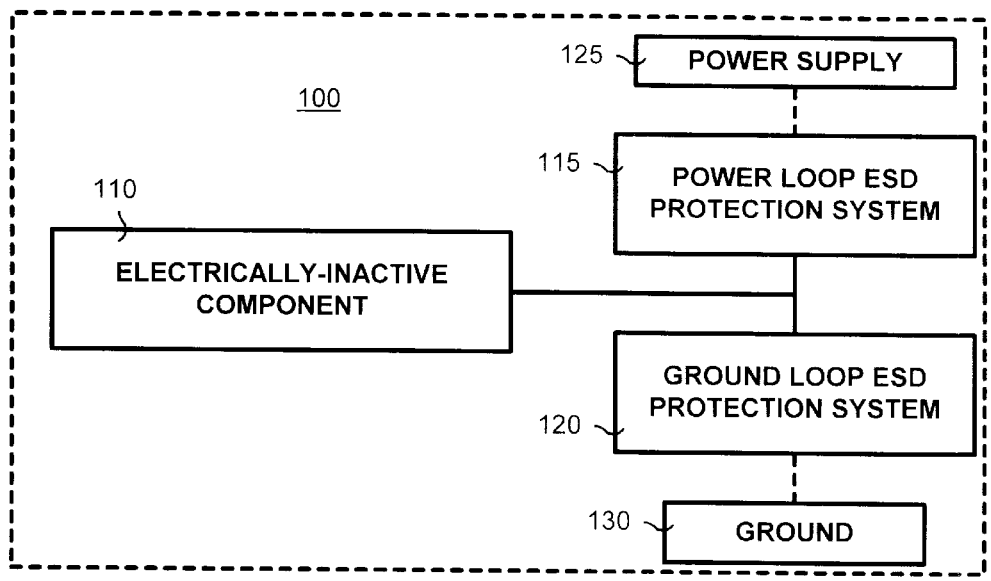
FIG. 1A is an overview block diagram of a first embodiment of the present invention showing an electrically-inactive component protected from an ESD event that occurs directly to the component.

FIG. 1A is an overview block diagram of a first embodiment of the present invention showing an electrically-inactive component protected from an ESD event that occurs directly to the component. A microsystem 100, which may be an integrated circuit or a micromachine, includes an electrically-inactive component 110. In general, the electrically-inactive component 110 is coupled to an ESD protection system of the present invention. On a power side of the circuit is a power loop ESD protection system 115 and on a ground side of the circuit is a ground loop ESD protection system 120.

The power loop ESD protection system 115 can be electrically coupled to a power supply 125 and the ground loop ESD protection system 120 can be electrically coupled to ground 130. Alternatively, the combination of the electrically-inactive component 110, the power loop ESD protection system 115 and the ground loop ESD protection system 120 does not require connection to the power supply 125 or ground 130 (as shown by the dashed lines). Instead, the combination can be electrically floating. The configuration as shown in FIG. 1A protects the microsystem 100 from damage due to an ESD event that directly strikes the electrically-inactive component 110.

Figure 1B:
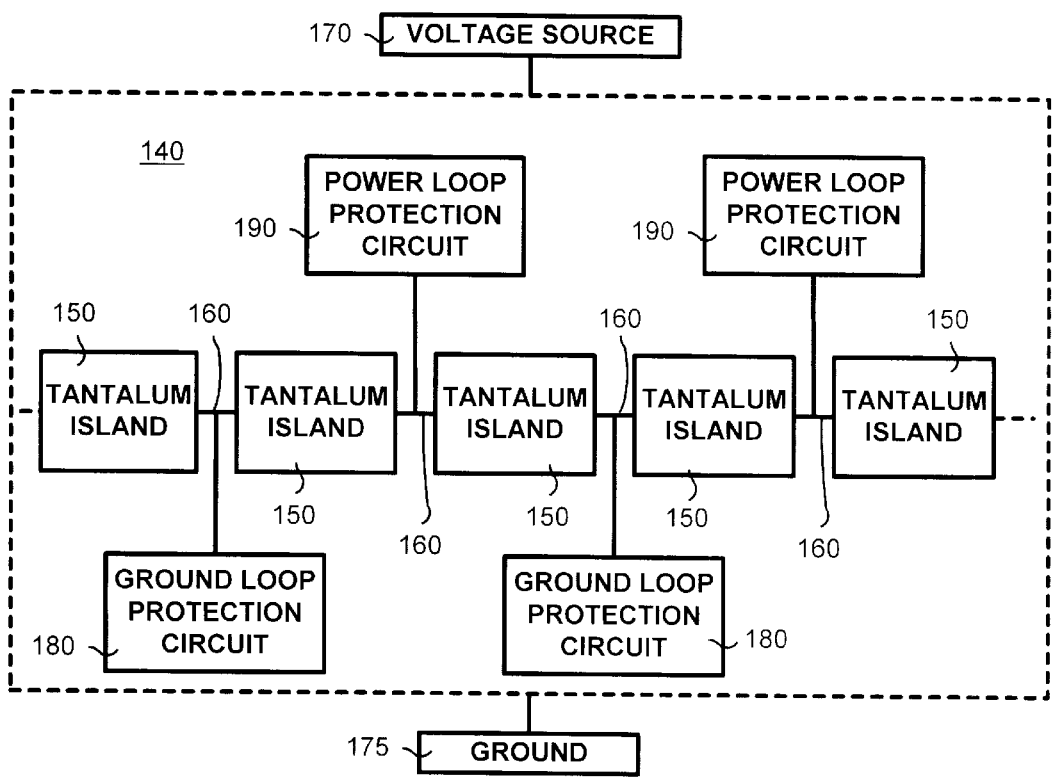
FIG. 1B is a block diagram of a thermal ink jet printhead illustrating a working example of the embodiment of FIG. 1A.

FIG. 1B is a block diagram of a thermal ink jet printhead 140 illustrating a working example of the embodiment of FIG. 1A. A plurality of protection layers 150, such as tantalum "islands" (isolation areas), are shown disposed near a top layer of the thermal ink jet printhead 140 and connected by bridges 160. The protection layers 150 are for protecting underlying layers from ink drop bubble collapse (discussed in detail below). In the example that follows, the material is tantalum, however, any other suitable material can be used, such as, for example, rhodium (Rh), molybdenum (Mo) and nickel (Ni). Each tantalum island 150 preferably overlies a resistor (not shown) that is used in the firing of ink drops.

Power to the thermal ink jet printhead 140 is provided by connecting the printhead 140 to a voltage source 170 and ground 175. On a ground side of the printhead 140 are ground loop protection circuits 180 that protect the tantalum islands 150 from an ESD discharge event. Similarly, on the power side of the printhead 140 are power loop protection circuits 190 that protect the tantalum islands 150. Preferably, these protect circuits include a diode to provide a single direction of charge to and from the printhead 140. When an ESD event strikes one or more of the tantalum islands 150, the accompanying charge is dissipated through either the power loop protection circuit 190 or ground loop protection circuit 180 and the ESD event is prevented from damaging sensitive components.

B. ESD Protection from an External ESD Event

Figure 2A:
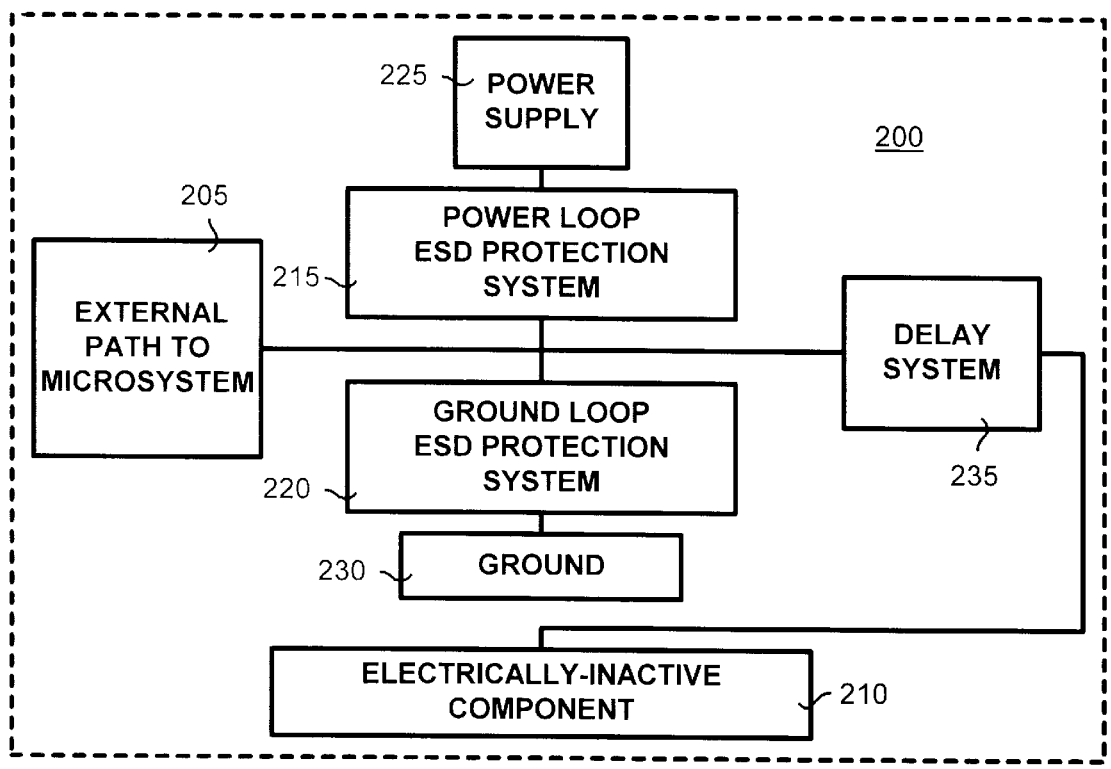
FIG. 2A is an overview block diagram of a second embodiment of the present invention showing an electrically-inactive component protected from an ESD event occurring at some point external to the component.

FIG. 2A is an overview block diagram of a second embodiment of the present invention showing an electrically-inactive component protected from an ESD event occurring at some point external to the component. A microsystem 200 includes an external path 205 that is coupled to the microsystem 200 and, absent any intervention, permits charge from an ESD event to pass to an electrically-inactive component 210. For example, an external path may include a conductive trace along the surface of a microsystem that may experience an ESD event and transmit the charge to an electrically-inactive component.

The microsystem 200 shown in FIG. 2A includes a power loop ESD protection system 215 for the power side of the microsystem 200 and a ground loop ESD protection system 220 for the ground side of the microsystem 200. The power loop ESD protection system 215 is preferably coupled to a power supply 225 while the ground loop ESD protection system 220 is preferably coupled to ground 230. A delay system 235 is placed near the electrically-inactive component 210 to allow the protection circuits 215 and 220 sufficient time to activate and dissipate any charge from an ESD event before it can damage the electrically-inactive component 210. Preferably, this delay system 235 is a resistor.

Figure 2B:
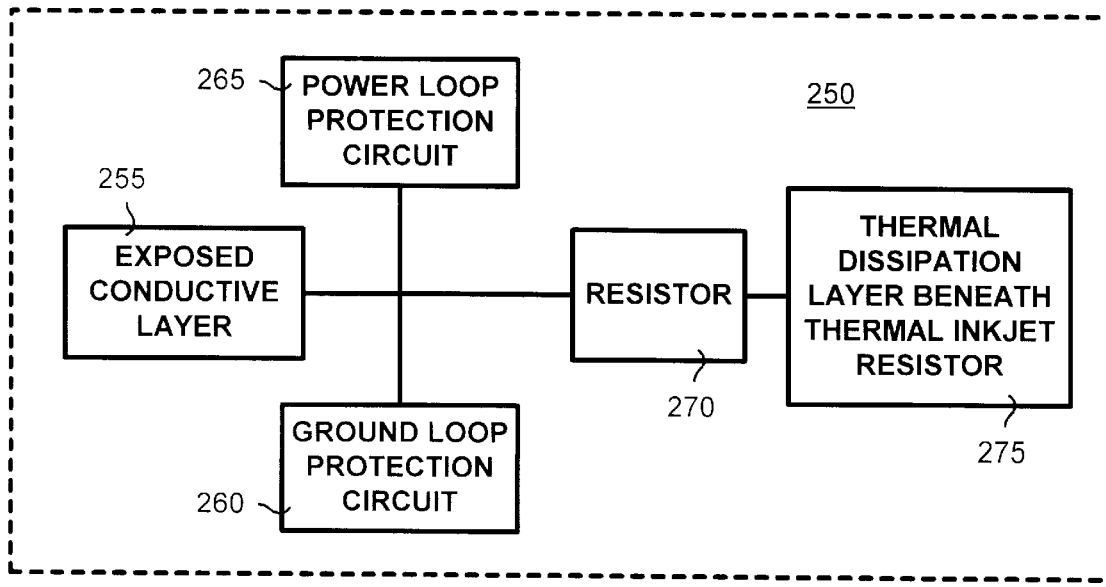
FIG. 2B is a block diagram of a thermal ink jet printhead illustrating a working example of the embodiment of FIG. 2A.

FIG. 2B is a block diagram of a thermal ink jet printhead 250 illustrating a working example of the embodiment of FIG. 2A. In this example, an exposed conductive layer 255 that is on the surface of the printhead but not in close proximity to other conductors is the external path to the microsystem. A ground loop protection circuit 260 and a power loop protection circuit 265 protect the power side and the ground side of the printhead 250. A resistor 270 acts as a delay system to delay charge from an ESD event from reaching a thermal dissipation layer 275 prior to activation of the protection circuits 260 and 265. The thermal dissipation layer 275, which lies beneath a thermal ink jet resistor (not shown), acts as a heat sink for the resistor, and thus, has no electrical function. In addition to protecting the thermal dissipation layer 275 from an ESD event, additional ESD protection is achieved for the resistor because the thermal dissipation layer 275 is in close proximity to the resistor. In this manner, an ESD event that occurs at the exposed conductive layer 255 is prevented from damaging both the electrically-inactive thermal dissipation layer 275 and the resistor.

II. Details of the ESD Protection System

The present invention includes an ESD protection system having several embodiments that provides protection from ESD events. Each of these ESD protection systems will now be discussed.

A. ESD Protection Systems From Direct ESD Events:
Electrically Floating ESD Dissipation System One embodiment of the present invention is an electrically floating ESD dissipation system. In this embodiment, an electrically-inactive component is part of the system and helps dissipate an ESD event. Preferably, the electrically-inactive component includes a large conductive area that may be, capacitively coupled to an electrical component or another electrically-inactive component. When an ESD event occurs, the charge generated by the ESD event is sent along a preferred path to the large conductive area where the charge is dissipated. The electrical component is protected by routing charge from the ESD event along a preferred path and dissipating the charge in the large conductive area and the electrically-inactive component is protected because it is electrically floating.

Figure 3:
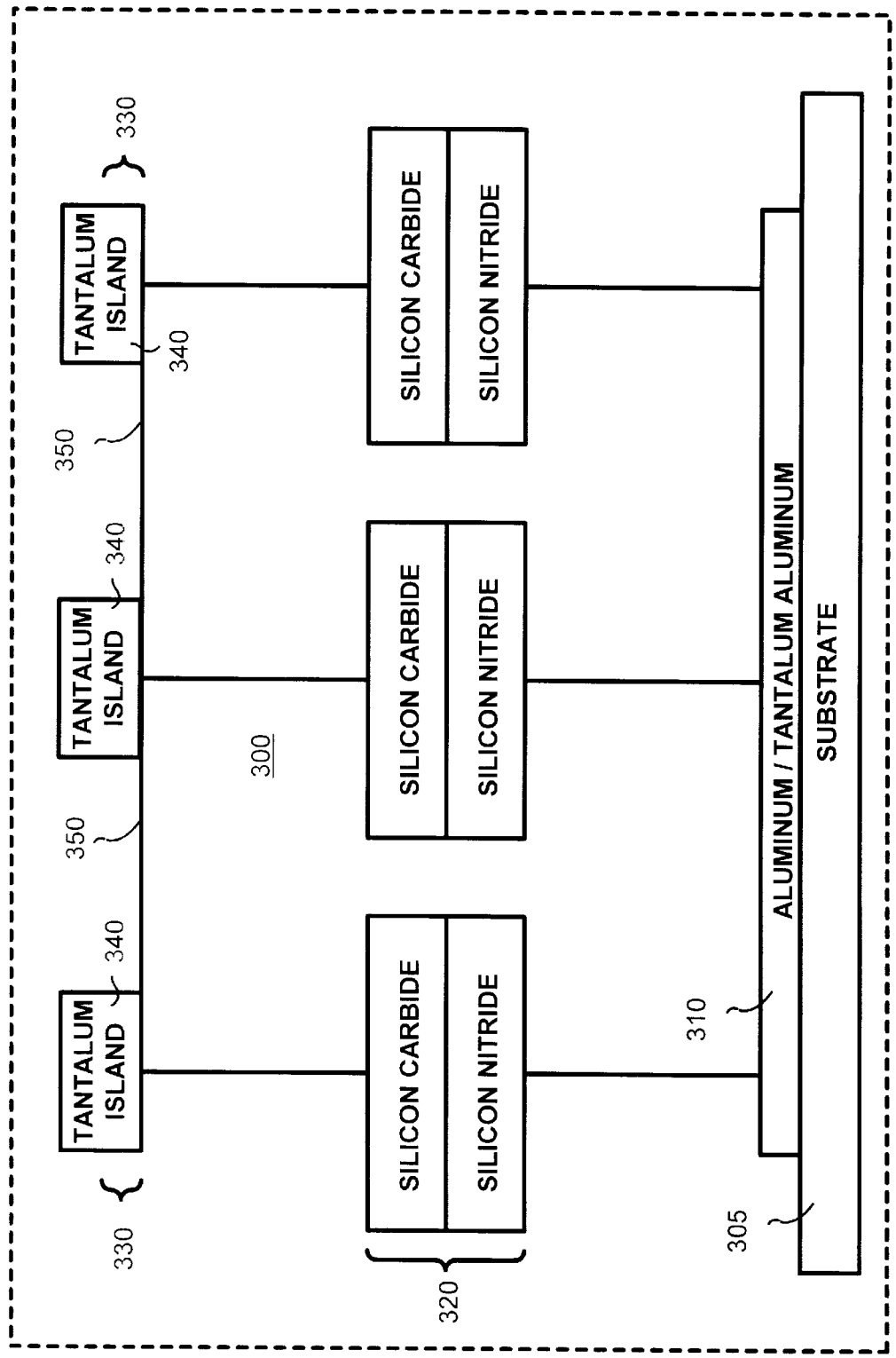
FIG. 3 illustrates a working example plurality of electrically-inactive components in a thermal ink jet printhead that are "tied" together to form a large capacitive area.

FIG. 3 illustrates a working example of this type of ESD dissipation system. In this working example the microsystem is a thermal ink jet printhead having a thin-film structure. The thin-film structure includes an electrical component layer (which in this example is a resistor), a dielectric layer overlying the resistor and a protection layer overlying at least a portion of the dielectric layer. The thin-film structure of the printhead may also include other suitable layers disposed on the substrate.

The protection layer is made from a material such as tantalum (Ta). Typically, it is preferable to deposit the tantalum on the microsystem as an individual isolated area or an "island" overlying the resistor instead of as a monolithic slab. This is because any thin films that may be deposited on top of the protection layer adhere better to the layers other than the tantalum protection layer. In most cases, each resistor is covered by an electrically-isolated island of tantalum. However, when an ESD event occurs, a charge builds up on these islands and the inability to dissipate this charge results in a large potential difference between the tantalum island and the resistor. This large potential difference can cause a breakdown of the passivation layer between the tantalum island and the resistor.

However, the ESD dissipation device of the present invention provides a balance between the two extremes of a monolithic slab and isolated islands. Namely, at one extreme, a large conductive area (such as a monolithic slab) serves essentially as a low-resistance bridge between islands that permits the flow of large currents and reduces the peak voltage across the passivation layer 320 during an ESD event. The monolithic slab provides a low-resistance connection between islands and provides good ESD protection (because a high amount of charge can be stored). However, these low-resistance bridges also provide an easy path for resistor failures to propagate throughout the microsystem and such propagation may cause a widespread failure of the microsystem.

At the other extreme, the large conductive area is virtually non-existent because there are isolated islands (or a high-resistance bridge between islands) that impede the current through the bridge and result in higher peak voltages. Moreover, when the islands are not connected at all there is essentially infinite resistance between the islands. Although resistor failures are not easily propagated through these high-resistance bridges, they do not provide adequate ESD protection.

The advantage of the ESD dissipation system of the present invention is that it balances the requirements of the thin-film structure of the printhead without any degradation of mechanical protective qualities. In particular, by conductively coupling the tantalum islands together the topcoat of the printhead adhesion is not sacrificed, damage caused by a failed resistor is not propagated to other resistors and cavitation and bubble collapse protection is maintained. Further, by connecting the tantalum islands any charge from an ESD event is spread throughout and dissipated within a plurality of tantalum islands rather than stored on a single tantalum island. Conductively linked tantalum islands greatly increase the charge-storing capability of the tantalum layer and reduce the voltage across the passivation layer during an ESD event, thereby avoiding damage to the passivation layer.

FIG. 3 is a side view of a thin-film structure 300 of a thermal ink jet printhead (not shown) and includes a substrate 305, a resistor layer 310 overlying the substrate 310 and a first passivation layer 320. The substrate 305 can be made of, for example, silicon or glass, the resistor layer 310 can be, for example, tantalum aluminum and the first passivation layer 320 can be made of, for instance, silicon carbide and silicon nitride. The resistor layer 310 includes resistors (not shown) that are formed by the etch patterns of a combination of a conductive material (such as, for example, aluminum) in the resistor layer 310 that overlays a resistor material (such as, for example, tantalum aluminum). A second passivation layer or protection layer 330 includes islands 340 that are connected to each other by bridges 350. As discussed above, this protection layer 330 is typically made of tantalum. Other aspects and details of thin-film structure in a thermal ink jet printhead are found in U.S. Pat. No. 5,187,500 entitled "Control of Energy to Thermal Ink jet Heating Elements" by Bohorquez et al., the entire contents of which are hereby incorporated by reference.

The bridges 350 connecting the islands 340 together are shown at the same layer as the protection layer 330 and may be created using standard thin-film processing techniques. Alternatively, bridges connecting the islands 340 together may be routed through the ink reservoirs (not shown) overlying the protection layer 330 or through additional metal layers (not shown) of the thin-film structure 300. Further, the geometry of the bridges 350 may be any shape that is convenient and effective.

Connecting together the islands 340 using the bridges 350 creates an electrically floating string of tantalum islands 340 that are capacitively coupled to the resistor layer 310, effectively forming an ESD dissipation system. The capacitance of the device is a function of the area of the protection layer 330 over the resistor layer 310, the passivation layer 320 thickness and the dielectric strength of the passivation. This increased capacitance permits the protection layer 330 to store a large charge without creating a large potential that may cause a breakdown of the passivation layer 320 and arcing to the resistor layer 310.

As shown in FIG. 3, the protection layer 330 is separated from the resistor layer 310 by a passivation layer 320 and effectively creates a capacitor. The voltage across a capacitor is:

$$V = q/C \qquad (1)$$

where V is the potential difference across the dielectric, q is the charge on each plate and C is the capacitance. Because the charge on the protection layer 330 attempts to distribute itself uniformly and only the protection layer 330 with the resistor layer 310 underneath acts a capacitor, only a portion of the charge ($q_{eff}$) actually affects the potential difference. Equation (1) then becomes:

$$V = q_{eff}/C \qquad (2)$$

where:

$$q_{eff} = q(A_{RL}/A_{CL}) \qquad (3)$$

and $A_{RL}$=area of resistor layer underneath the protection layer;

$A_{CL}$=total area of protection layer (islands and bridges).

Combining these results gives:

$$V = (q/C)*(A_{RL}/A_{CL}) \qquad (4)$$

From the above, V can be reduced either by increasing C or $A_{CL}$ because $A_{RL}$ typically will not be changing and q is assumed to be a constant.

Because passivation breakdown occurs when the voltage difference between the dielectric reaches some critical value, a more robust ESD dissipation system can be made by increasing C or reducing q. Since capacitors are additive when connected in parallel, connecting the islands together greatly increases the capacitance. Moreover, because an ESD event may be viewed as a high-voltage/low-charge event, the charge will try to distribute itself uniformly over the protection layer. Therefore, increasing the area of the protection layer decreases the charge density. This reduction in charge density has the beneficial effect of reducing the charge on the capacitor (including the electrically-inactive component) and further lowering the voltage across the dielectric.

1) ESD Dissipation System Held at Some Potential with Severable Link

In another embodiment of the present invention, the ESD protection device includes an ESD dissipation system (similar to the system discussed above) that conductively couples an electrically-inactive component to an electrical component. This combination is held at a same potential or ground and thereby greatly reduces or eliminates an ESD event. In addition, this embodiment can include a severable link (such as a fuse) so that the electrically-inactive component and the electrical component are kept at the same potential for a certain period of time before the connection between them is severed. Thus, the ESD protection system can be used for a desired period of time (such as during the manufacturing process), yet not affect the normal operation of the microsystem.

As discussed above, damage to an electrically-inactive component from an ESD event can be reduced by providing an ESD dissipation system having a large conductive area. This dissipation system provides a large conductive area whereby charge from the ESD event can be safely dissipated. A further reduction in sensitivity to an ESD event can be obtained by referencing the ESD dissipation system to some known potential or ground. Because an ESD event can only occur when a potential difference exist between objects (such as an electrically-inactive component and an electrical component), keeping the components at the same potential greatly reduces the likelihood that ESD damage can occur.

In certain circumstances, it may be desirable to keep the potential of the components at a same potential for a period time (for example, during manufacturing), and then discontinue holding the objects at the same potential. In such circumstances, a severable conductive link (such as a fuse) between the components can be used to keep the components at the same potential for a period of time after which the conductive link between the objects is severed.

In a working example of the above-described ESD dissipation system, a thermal ink jet printhead having a thin-film structure similar to the structure discussed above will be used. In general, the protection layer overlying the resistor and dielectric passivation layers protects the resistor against cavitation damage and bubble collapse. During normal operation of the printhead, ink within a reservoir on the printhead is heated by the resistor and ejected. This expansion and subsequent collapse of a bubble of ink results in a "water hammer" effect that constantly strikes the underlying layer. Eventually, this cavitation and bubble collapse will erode the dielectric layer and the resistor layer and cause resistor failure. The protection layer reduces or eliminates damage to the resistor due to these adverse factors.

As discussed above, when the islands of the protection layer (usually made of tantalum) are connected together, they form a large conductive area and can dramatically reduce sensitivity to an ESD event. However, these tantalum islands are usually electrically isolated, and a further reduction in sensitivity to ESD events can be obtained by connecting the tantalum islands and the resistors to the same potential or both to ground. Moreover, in order to reduce or prevent damage from an ESD event during manufacturing, the tantalum islands and the resistors, both are preferably connected to a positive voltage pad of the printhead. Because all resistors in the printhead are connected to the positive voltage pad through a common bus, this ensures that little or no potential difference exists between the resistors and the overlying tantalum islands.

Connecting the tantalum islands to each other and the positive voltage pad has no impact on printhead operation when the printhead contains no ink. However, when the printhead is filled with ink a conducting path between the tantalum islands and ground is established through the ink. Therefore, if the tantalum islands are at the potential of the positive voltage pad during normal printhead operation, a current will flow through the ink and to ground causing an anodic oxidation of the tantalum islands. Because this oxidation can adversely affect printhead performance, it is undesirable to have the tantalum islands at the potential of the positive voltage pad during normal printhead operation.

In order to avoid the aforementioned problems, the tantalum islands are connected to the positive voltage pad and held at the same potential as the resistors only during the manufacturing process. This is accomplished using a severable conductive link to connect the tantalum islands to the positive voltage pad. In this working example, the severable link is a fuse. During manufacturing the tantalum islands and the resistors are held at the potential of the positive voltage pad, but after the pen is filled with ink the connection between the tantalum islands and the positive voltage pad is severed by opening the fuse. In this working example, the fuse is opened by using a transistor (preferably a switching field-effect transistor (FET)) that is similar to that used to fire the resistors. Because thermal ink jet printheads contain unused addresses, the FETs for these fused links could be opened through one of these unused addresses without adding significant circuit complexity to the printhead.

Figure 4:
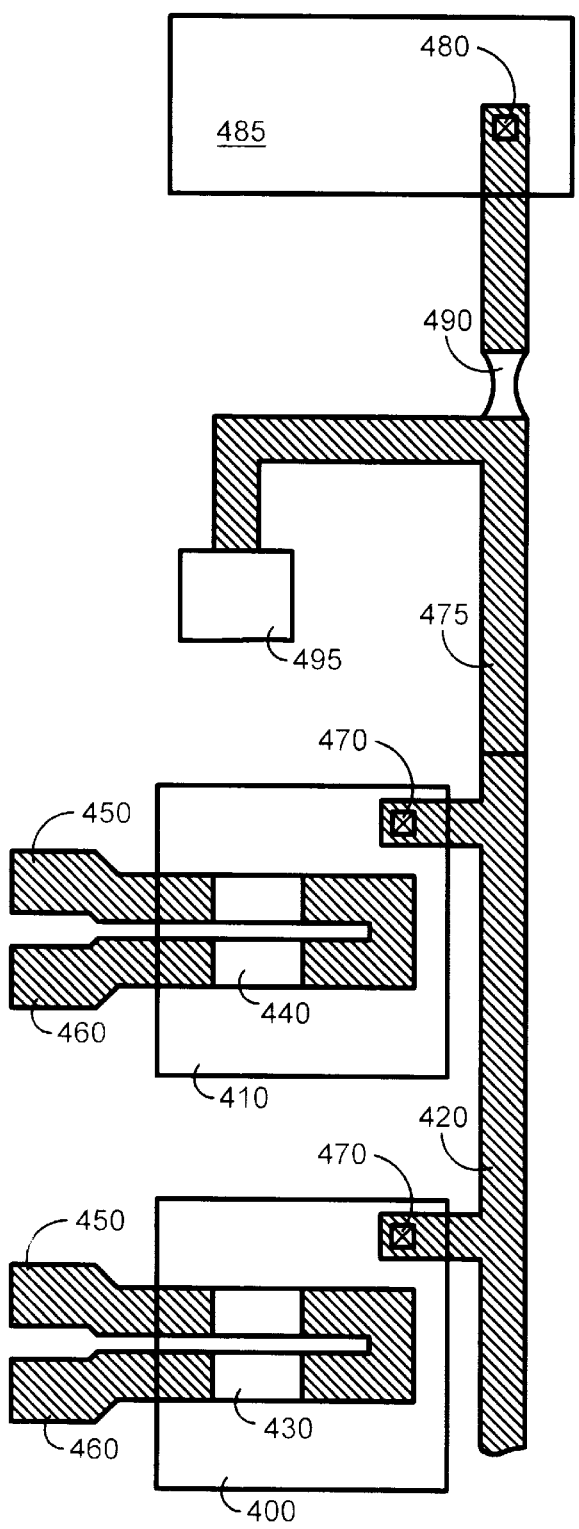
FIG. 4 is a working example of an embodiment of the present invention that includes a severable link and multiple contacts.

FIG. 4 is a plan view of a working example of this embodiment whereby each tantalum island on a thermal ink jet printhead has its own contact. As shown in FIG. 4, a first tantalum island 400 and a second tantalum island 410 are connected by a bridge 420. The first tantalum island 400 is positioned above a first resistor 430 and, similarly, the second tantalum island 410 is positioned above a second resistor 440. Referring also to FIG. 3, the tantalum islands are separated from the resistors by at least a dielectric passivation layer. Two resistors are depicted for illustrative purposes only, and the printhead will typically contain a plurality of resistors and tantalum islands. Both the first resistor 430 and the second resistor 440 include an input 450 (such as a positive voltage input) and a drain 460 (such as a FET drain).

A contact 470 on each tantalum island conductively couples the tantalum islands to the underlying resistors. A bus 475 connects the tantalum islands and the resistors via a contact 480 to a positive voltage pad 485, and a severable link 490 is located between the bus and the pad 485. A switching device 495 (for example, a transistor) may be used to open the severable link 490 at a desired time in order to sever the connection between the positive voltage pad 485 and the bus 475. Preferably, the switching device 495 is a field-effect transistor (FET). In this manner, both the tantalum islands and the resistors are held at the potential of the positive voltage pad 485 until the severable link 490 is opened. The embodiment shown in FIG. 4 has the advantage of providing a low-resistance connection between all the islands and can improve the speed at which charge from an ESD event is dissipated.

Figure 5:
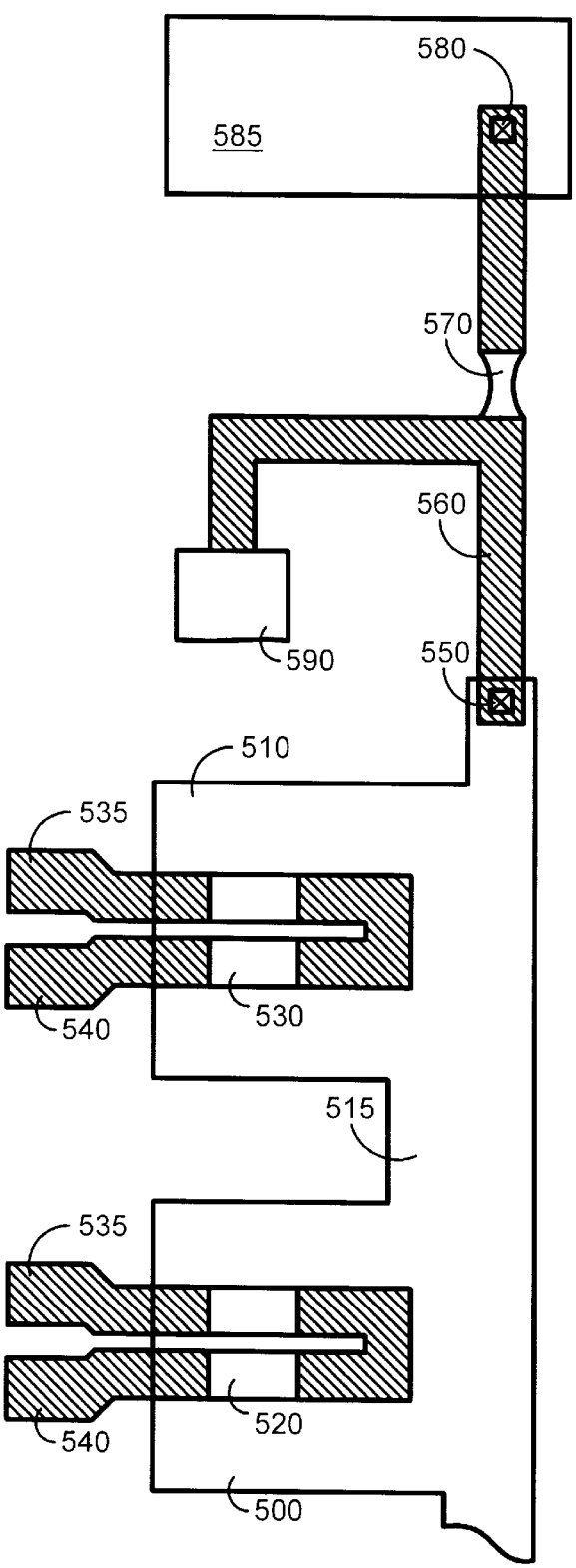
FIG. 5 is a working example of an embodiment of the present invention that includes a severable link and a single contact.

FIG. 5 is a working example of the present invention and shows a plan view of a variation of the embodiment shown in FIG. 4 whereby only one contact is used to connect the tantalum islands to a severable link structure. In particular, a first tantalum island 500 and a second tantalum island 510 are connected by a bridge 515. As in the previous embodiment, a first resistor 520 is below the first tantalum island 500 and a second resistor 530 is below the second tantalum island 510. Each resistor has an input 535 and a drain 540. The tantalum islands are connected by a contact 550 to a severable link structure that includes a bus 560, a severable link 570 and another contact 580 connecting the bus 560 to a positive voltage pad 585. A switching device 590 is connected to the bus 560 and provides a way for the severable link 570 to be broken at the desired time.

The embodiment shown in FIG. 5 is generally simple to implement because one contact is needed to connect tantalum islands covering the resistors to the severable link structure. In addition, this embodiment may easily be used to connect a number of tantalum islands to a severable link structure using a single contact.

The embodiments of FIGS. 4 and 5 also provide additional protection even after the severable link has been opened. In particular, the connected tantalum islands remain connected to the switching device even after the severable link has been severed. In a preferred embodiment, the switching device is a large LDMOS FET and the connected tantalum islands remain connected to the drain of this FET. After the FET is used to open the severable link, the FET continues to serve as an ESD protection device for the connected tantalum islands. Moreover, other types of ESD protection devices also may be used to protect the connected tantalum islands from an ESD event.

Connecting the protection layer to ground can draw excessive current from the power supply and cause a fire if a resistor failure occurs. Catastrophic resistor failures can form hard shorts between the remaining resistor layer and the protection layer. To avoid the risk of fire, the protection layer on many thermal ink jet printheads is isolated from ground. Hence, it is possible that the switching device used to sever the connection between the severable link structure and the positive voltage pad could become shorted to ground by an ESD event either before or after the link has be severed. Consequently, it may be desirable to protect against such a possibility by adding a secondary severable link between the switching device and the connected tantalum islands.

Figure 6:
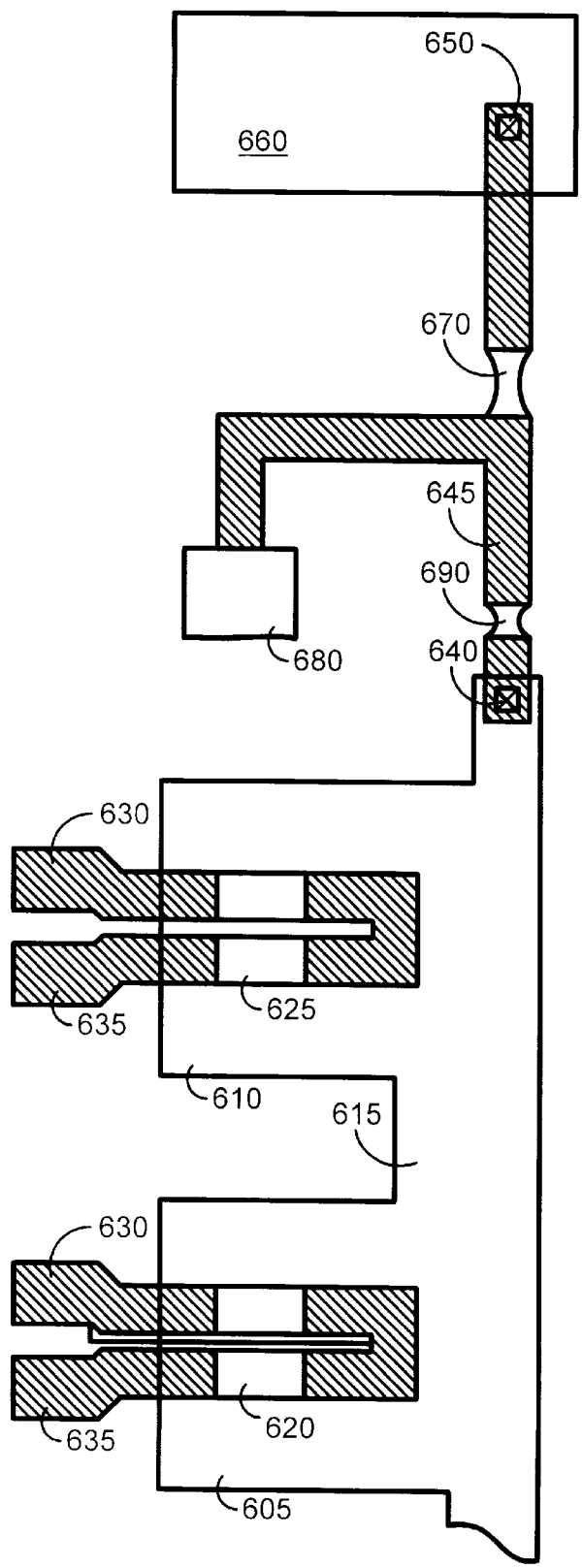
FIG. 6 is a working example of an embodiment of the present invention that includes a secondary severable link.

FIG. 6 is generally similar to the embodiment of FIG. 5 with the addition of a secondary severable link. As shown in FIG. 6, a first tantalum island 605 and a second tantalum island 610 are connected by a bridge 615. The first tantalum island 605 covers a first resistor 620 and the second tantalum island 610 covers a second resistor 625. Both resistors have an input 630 and a drain 635. A single contact 640 connects the connected tantalum islands to a bus 645. The bus 645, which is typically at a lower level that the tantalum protection layer, is connected by a contact 650 to a positive voltage pad 660. A severable link 670 connects the bus 645 to the positive voltage pad 660 and may be severed by a switching device 680 that is connected to the bus 645. A secondary severable link 690 connects the connected tantalum islands to the bus 645.

The addition of the secondary severable link 690 does not affect the ability of the switching device 680 to open the severable link 670. Because the connected tantalum islands are connected at the contact 640, the secondary severable link 690 is designed so that any charge dissipated from the tantalum islands during the opening of the severable link 670 does not damage the secondary severable link 690. This secondary severable link 690 then remains after the connected tantalum islands are disconnected from the positive voltage pad 660 and provides protection against excessive current draw from a power supply (and the risk of fire) in the event of a catastrophic resistor failure.

Figure 9:
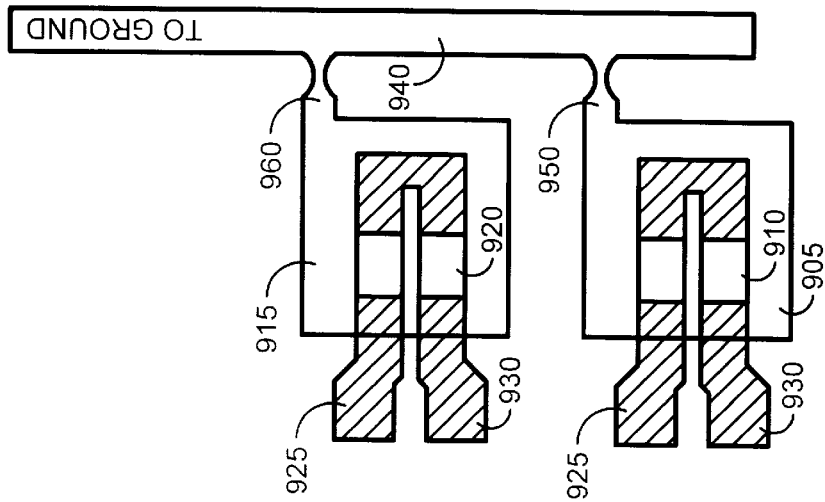
FIG. 9 is a working example of an embodiment of the present invention that includes multiple severable links incorporated into a protection layer of the printhead.
Figure 8:
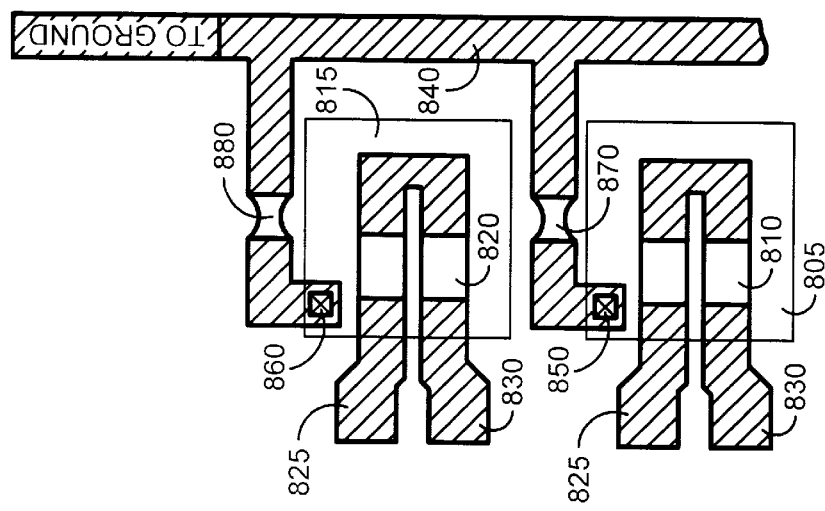
FIG. 8 is a working example of an embodiment of the present invention that includes multiple severable links and individual contacts.
Figure 7:
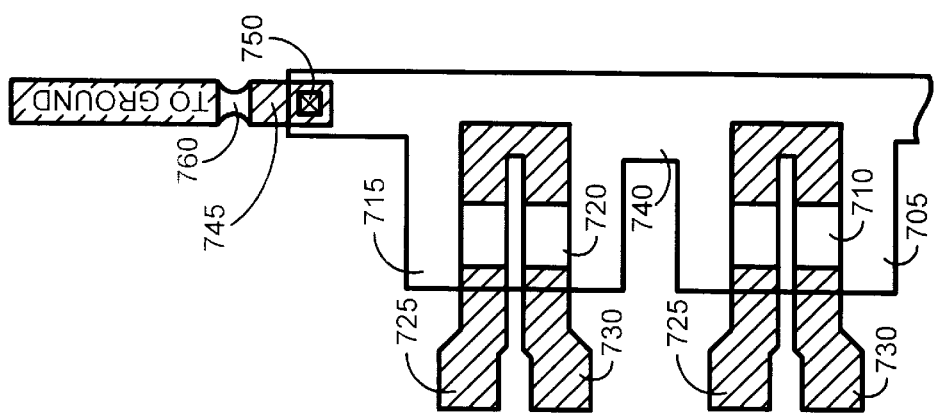
FIG. 7 is a working example of an embodiment of the present invention that includes a single severable link connected to ground.

FIGS. 7–9 are working examples of other embodiments in which an electrically-inactive component is conductively coupled to an electrical component and held at ground. Further, these embodiments include a severable link that provides overcurrent protection in the occurrence of a catastrophic resistor failure.

Referring to FIG. 7, a first tantalum island 705 covers a first resistor 710 and a second tantalum island 715 covers a second resistor 720. The resistors both include an input 725 and a drain 730. Moreover, the first tantalum island 705 and the second tantalum island 715 are connected by a bridge 740. The connected tantalum islands are connected to a lower layer bus 745 by a contact 750 and the bus 745 is connected to ground by a severable link 760. This embodiment is one of the easiest to implement because only one contact 750 and one severable link 760 are required to protect the entire connected tantalum islands.

Another embodiment is shown in FIG. 8, in which the tantalum islands are bridged by a bus on a lower layer and each island has its own contact and fuse. Specifically, FIG. 8 shows a first tantalum island 805 overlying a first resistor 810 and a second tantalum island 815 overlying a second resistor 820. Each resistor has an input 825 and a drain 830, and the first tantalum island 805 is connected to a bus 840 at a lower layer by a first contact 850. Similarly, the second tantalum island 815 is connected to the bus 840 by a second contact 860. Between the first contact 850 and the bus 840 is a first severable link 870 and between the second contact 860 and the bus 840 is a second severable link 880. As such, both the tantalum islands are connected by the bus 840, and the bus 840 is connected to ground.

The embodiment shown in FIG. 8 provides contact to ground through the bus 840 at a conductor layer. In addition, the failure of a resistor will isolate from ground the single tantalum island overlying the resistor while the other islands will remain grounded.

FIG. 9 illustrates another embodiment whereby a severable link is formed in the protection layer itself. A first tantalum island 905 covers a first resistor 910 and a second tantalum island 915 covers a second resistor 920. As in other embodiments, the resistors include an input 925 and a drain 930. A bus 940 that is on the same layer as the tantalum islands and made from the same material is connected to ground. The first tantalum island 905 is connected to the bus 940 by a first severable link 950 formed out of the protection layer material (in this example, tantalum). Similarly, the second tantalum island 915 is connected to the bus 940 by a second severable link 960 also formed out of the protection layer material.

The embodiment shown in FIG. 9 is easy to implement because it only requires that the pattern of the protection layer be changed. Due to the high resistance and melting temperature of the tantalum it may be more difficult than other embodiments to form a good severable link in the tantalum. However, the embodiment of FIG. 9 may be useful if other materials other than tantalum are used for the protection layer (such as, for example, rhodium (Rh), hafnium (Hf), zirconium (Zr) and nickel (Ni)).

B. ESD Protection from External ESD Events

The present invention includes several embodiments of an ESD protection system that provides protection from an ESD event that occurs external to the electrically-inactive component of the microsystem. Each of these ESD protection systems will now be discussed.

1) Sacrificial ESD Breakdown System

The preceding embodiments of the present invention have discussed preventing and dissipating an ESD event. In this embodiment of the present invention, a preferential ESD breakdown location is created in an electrically-inactive portion of a microsystem using a shunt device. Consequently, if the ESD protection systems that are used in the microsystem fail or are ineffective, the shunt device will direct the ESD event to a preferential ESD breakdown location where the resulting damage will not compromise the operation of the microsystem.

One advantage of this embodiment is that it is simple and economical to implement and force any damage from an ESD event to be done in a predictable location of the microsystem. Thus, no matter what the magnitude of the ESD event this embodiment of the present invention protects the functionality of the microsystem.

Figure 10:
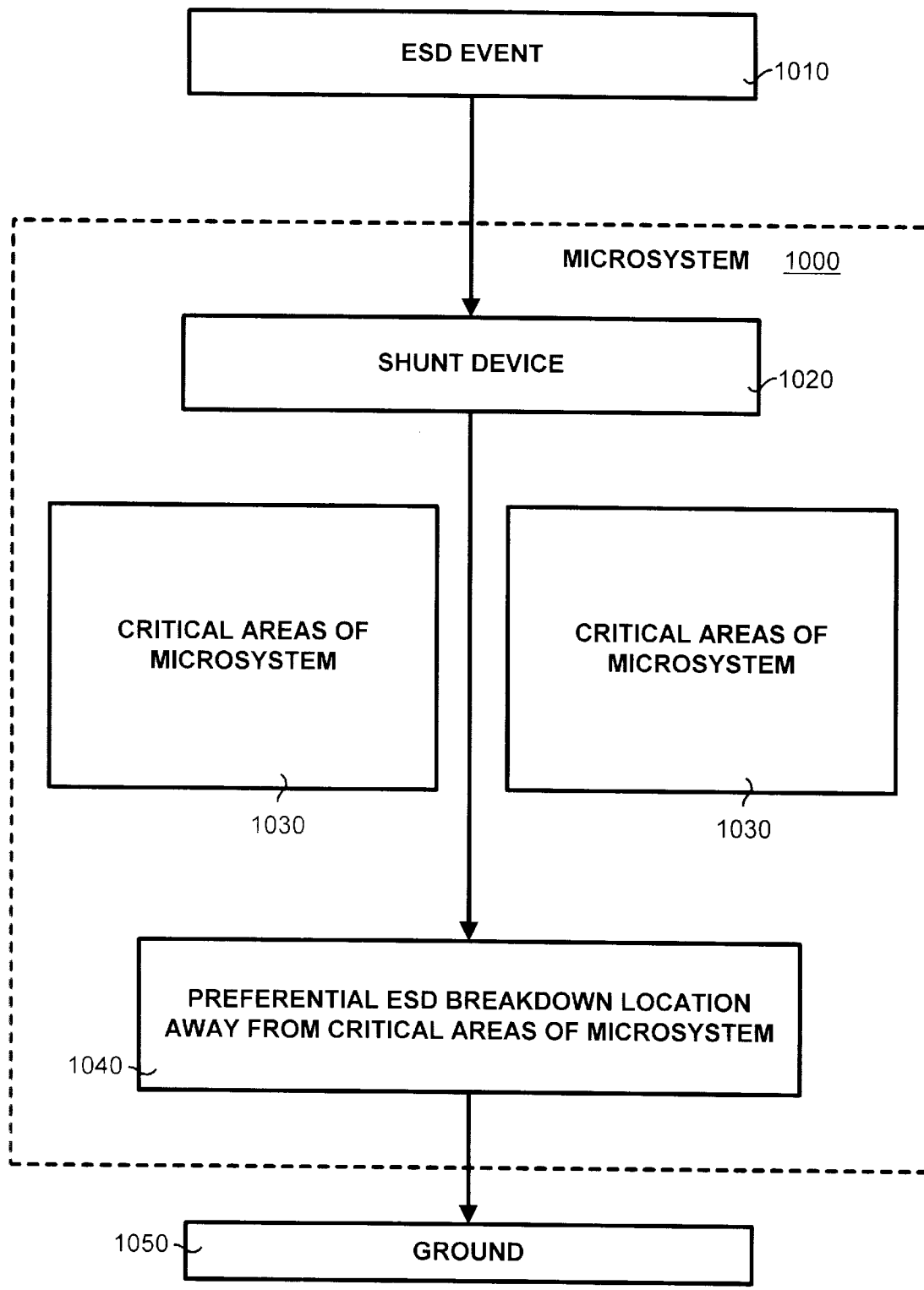
FIG. 10 is an overview block diagram of a sacrificial ESD protection system of the present invention.

FIG. 10 is an overview block diagram of a sacrificial ESD protection system for a microsystem 1000 of the present invention. When an ESD event 1010 strikes the microsystem 1000 the resulting discharge is directed by a shunt device 1020 away from the critical areas 1030 of the microsystem 1000. Instead, the shunt device 1020 directs the discharge from the ESD event 1010 to a preferential ESD breakdown location 1040 and eventually to ground 1050. The preferential ESD breakdown location 1040 is away from the critical areas 1030 of the microsystem 1000 and therefore provides a sacrificial breakdown location that protects the critical areas 1030 of the microsystem 1000 from ESD damage.

Figure 11:
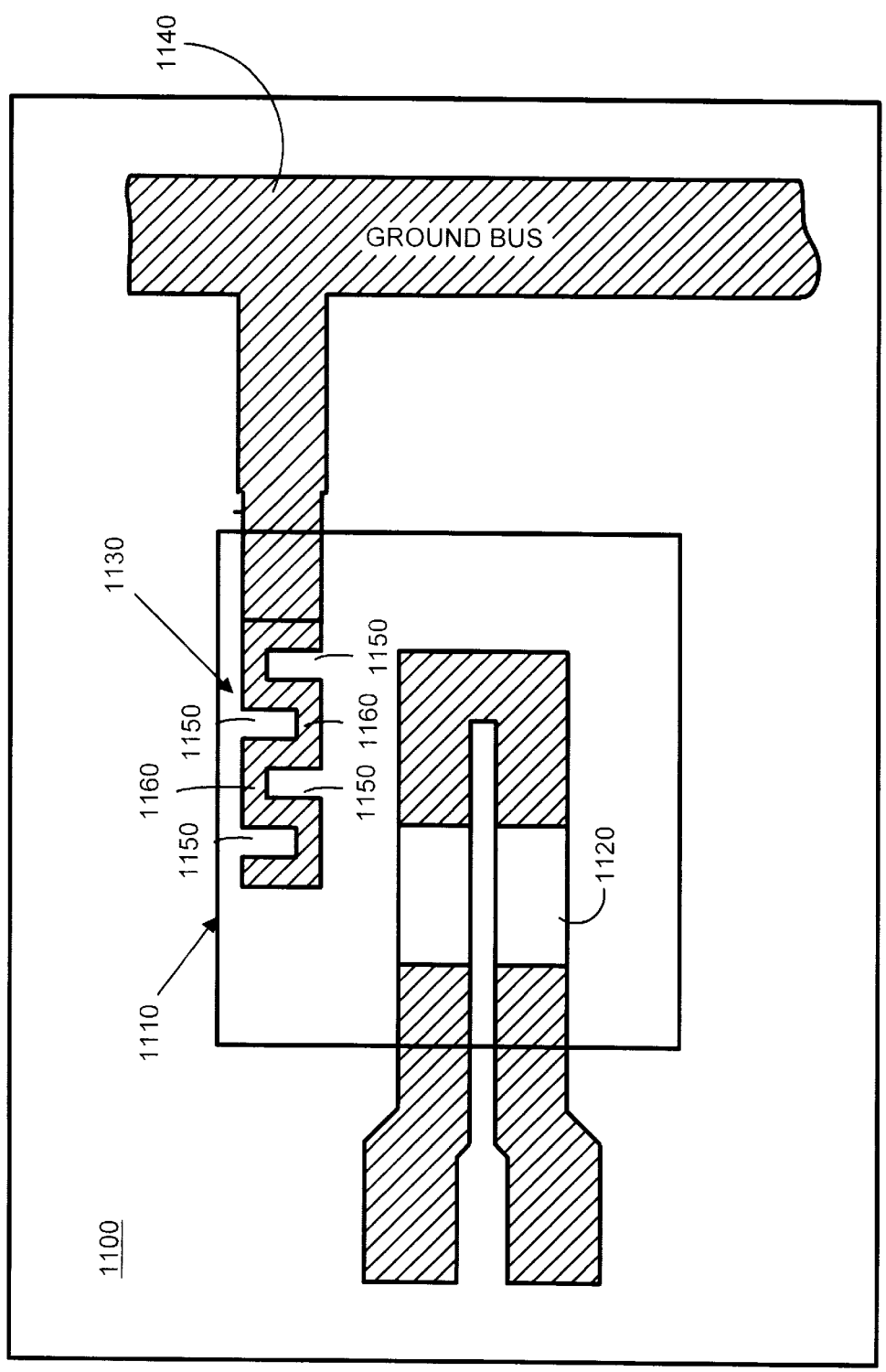
FIG. 11 is a working example of the sacrificial ESD breakdown system of the present invention shown in FIG. 10.

FIG. 11 is a working example of the sacrificial ESD breakdown system of the present invention shown in FIG. 10. In particular, a thermal ink jet printhead 1100 is shown having a thin-film structure. The thin-film structure of FIG. 11 is shown in FIG. 3 and includes several layers including a protection top layer 1110 overlying a passivation layer (not shown), a metal layer (not shown) under the passivation layer and a resistor layer 1120 under the metal layer. Typically, the protection layer 1110 is a tantalum island, the passivation layer is a dielectric (such as silicon carbide and silicon nitride), the metal layer is aluminum and the resistor layer 1120 is made of tantalum aluminum. Other materials can be used in place or in addition to these materials.

A shunt device, which in this working example is a serpentine structure 1130, is made from a conductive material and located under the protection layer 1010 in order to create a preferred location for breakdown from an ESD event to occur. Preferably, this conductive material is the same material as the metal layer although other materials may be used. The serpentine structure 1130 is connected to a ground bus 1140 and provides a path to ground for charge from the ESD event.

The serpentine structure 1130 creates a preferential breakdown location in at least two ways. First, the structure 1130 includes high-aspect ratio trenches 1150 between each segment 1160 and are therefore difficult to manufacture. This means that the trenches 1150 (which are filled with a passivation material) will have a lower passivation thickness and lower dielectric strengths than other portions of the thin-film structure. Second, during a time when charge from the ESD event is within the serpentine structure 1130, the charge will be greatest at the inside corners of each segment 1160. These two factors cause the passivation layer to be breached in a location away from the resistor layer 1120, namely, at the serpentine structure 1130. Once a breakdown has occurred, the charge is dissipated to ground by a connection to a ground bus 1140.

In the absence of the sacrificial ESD breakdown system of the present invention, an ESD event to the surface of the printhead 1100 will usually penetrate the passivation layer and connect with the metal layer and the resistor layer 1120. This can potentially cause irreversible damage to the resistor layer 1120 that can compromise the operation of the printhead 1 100. However, the sacrificial ESD breakdown system of the present invention provides a preferred path and breakdown location for charge from the ESD event that maintains the functionality of the printhead 1100.

The serpentine structure 1130 protects the resistor layer 1120 from ESD damage by providing a preferred region that is more desirable to charge from an ESD event than the resistor layer 1120. The serpentine structure 1130 provides an area of high topography that has a lower resistance (because it is connected directly to the ground bus 1140) than the higher-resistance resistor layer 1120 and thus provides a preferred path for the charge. Moreover, even if a hard short were to form from the ESD event, such a defect would only ground the protection layer 1110 (in this example, the tantalum island). Thus, the ESD defects do not occur at the U-shape resistor layer 1120 thereby avoiding a situation where constant current is drawn through the resistor layer 1120 leading to the subsequent failure of the resistor layer 1120.

2) Capacitive Coupling with Shielding

Another embodiment of the present invention includes ESD protection systems that capacitively couple an electrically-inactive component and at least one metal layer to provide a "shield" around an electrically-inactive component. Further, the systems of the present invention divide large conductive areas within the microsystem into various planes. These planes, which surround the electrically-inactive component on most or all sides, are connected to existing ESD protection devices and shield the electrically-inactive component by providing a preferred path for charge from an ESD event. A shunt bar can also be used to provide a preferred path to flow the charge. The preferred path is preferably away from the electrically-inactive component. Any excess charge is stored in these various planes thereby avoiding a build-up of high-charge areas in any one plane that may cause damage the microsystem.

For example, in a thermal ink jet printhead, an ESD event can cause a perforation in the passivation layer that can short the resistor and the protection layer and cause serious problems (such as fires). Therefore, it is desirable to keep the charge from an ESD event as far away as possible from an electrically-inactive component. Many current systems use a Faraday cage or charge sheath located around a component to be protected and provide approximately a ⅜-inch radius between the component and the conductive shield. Given the small dimensions of microsystems (such as a thermal ink jet printhead), however, this spacing typically cannot be provided.

Figure 12:
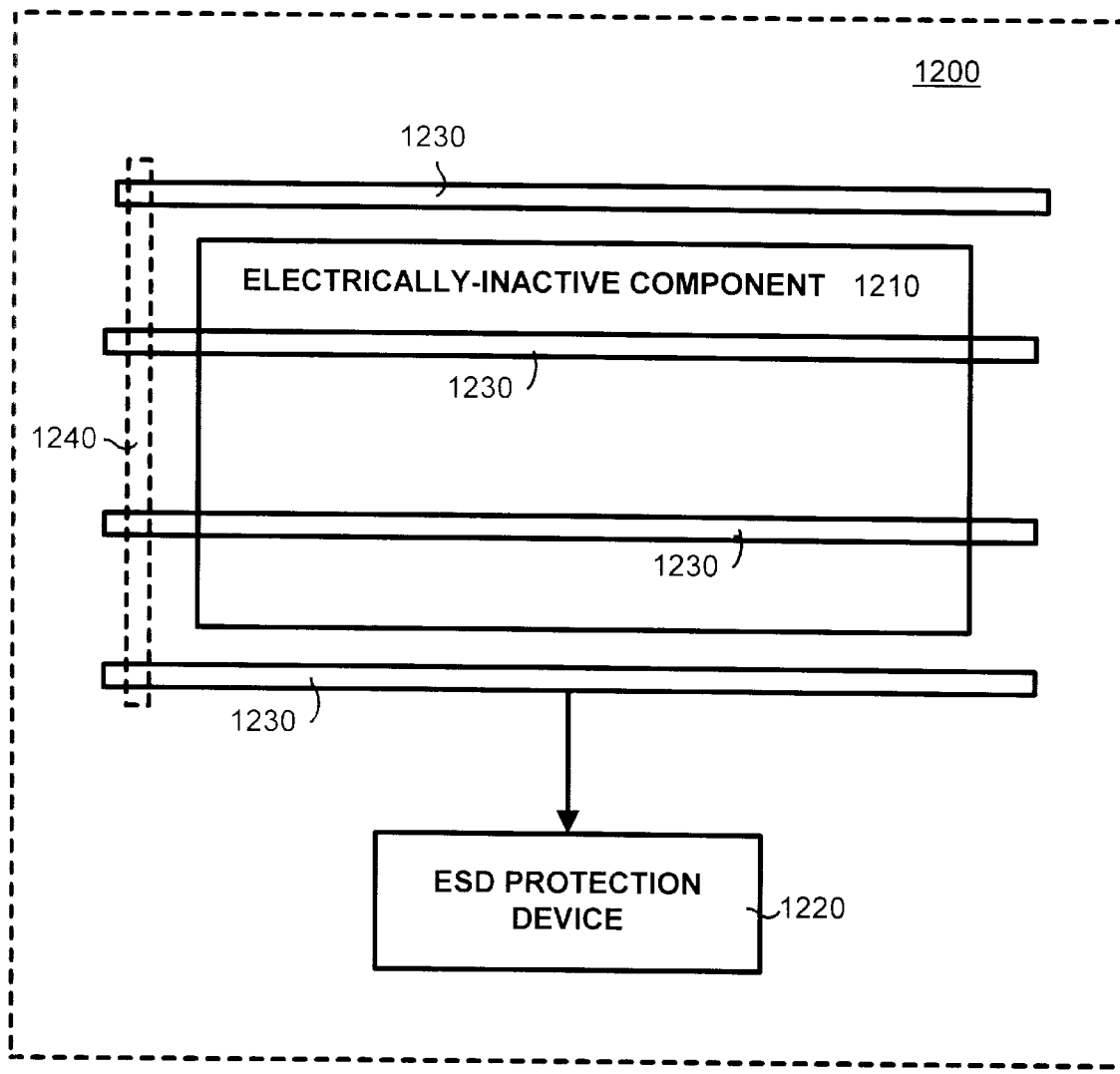
FIG. 12 is an overview block diagram of the capacitive coupling with shielding embodiment of the present invention.

However, the present invention solves this problem. Namely, FIG. 12 is an overview block diagram of the capacitive coupling with shielding embodiment of the present invention. In particular, a microsystem 1200 includes an electrically-inactive component 1210 and an ESD protection device 1220. Surrounding the electrically inactive component 1210 is a plurality of shielding layers 1230 made from a conductive material. These layers 1230 are capacitively coupled to each other and divide any charge from an ESD event onto the various layers 1230. A shunt bar 1240 (dashed line) can be used to conductively couple the layers 1230 and provide a preferred path for the charge to follow. The layers 1230 are connected to the ESD protection device 1220 and provide a constant path for the dissipation of charge.

This embodiment of the present invention provides several advantages including a constant path whereby the charge from an ESD event can be routed. In addition, this embodiment divides the charge between several layers of the microsystem to reduce the amount charge contained within each layer. Further, a shunt bar can be used in several embodiments to provide an ESD event with a preferred path to follow. Specifically, the preferred path for the charge is through an ESD protection device instead of through the electrically-inactive component.

Figure 13:
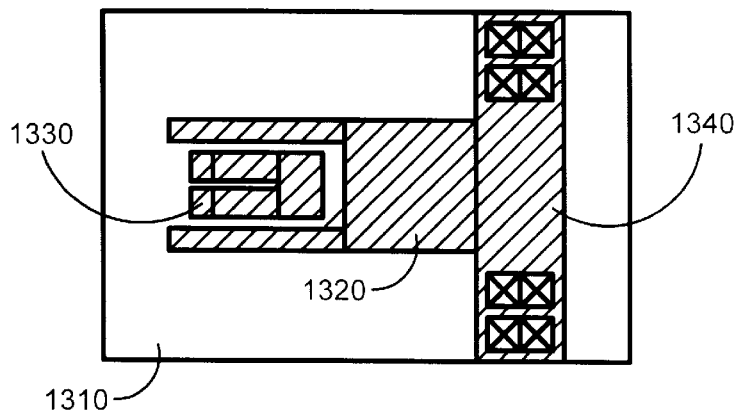
FIG. 13 is a working example of a first embodiment of the capacitively coupled shielded ESD protection system.
Figure 14:
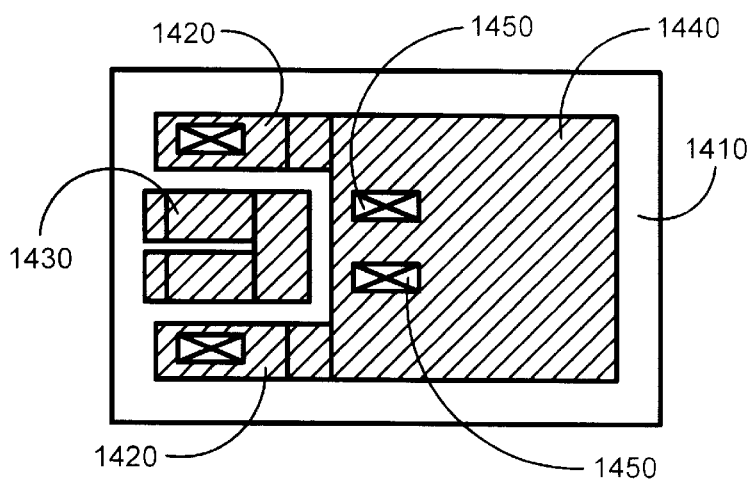
FIG. 14 is a working example of a second embodiment of the capacitively coupled shielded ESD protection system.
Figure 15:
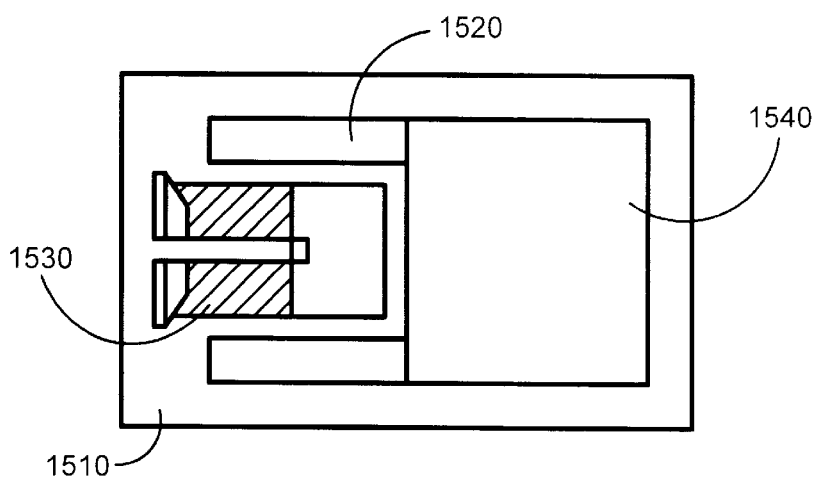
FIG. 15 is a working example of a third embodiment of the capacitively coupled shielded ESD protection system.

In the working examples shown in FIGS. 13–15, the thermal ink jet printhead is used similar to the examples above. FIG. 13 is a working example of a first embodiment of the capacitively coupled shielded ESD protection system. In this embodiment, a "tuning fork" design shields an electrical component from an ESD event. In particular, a tantalum island 1310 overlies a metal layer 1320 and a resistor layer 1330. The metal layer 1320 includes two segments that extend around the resistor layer 1330 to shield the resistor layer 1330 from an ESD event. A shunt bar 1340 is connected to an ESD protection device (not shown) that provides a continuous dissipation of charge. The tantalum island 1310 is connected to the shunt bar 1340 and provides a discharge path away from the resistor layer 1330. The resistor layer includes its own contacts (not shown) under the tantalum island 1310 and metal layer 1320 for added protection.

FIG. 14 is a working example of a second embodiment of the capacitively coupled shielded ESD protection system. In this embodiment, a shunt bar is located closer to the resistor layer to provide a more attractive path for an ESD event to follow. A tantalum island 1410 overlies a metal layer 1420 that overlies a resistor layer 1430. A shunt bar 1440 is located nearly adjacent the resistor layer 1430 (as seen from the top) and is connected with the tantalum island 1410 via contacts 1450. These contacts 1450 and the shunt bar 1440 are located in close proximity to the resistor layer 1430 and serve to shunt more of the charge from an ESD event away from the resistor layer 1430.

FIG. 15 is a working example of another embodiment of the capacitively coupled shielded ESD protection system. In this embodiment, a tantalum island is conductively coupled to an electrically floating metal layer around a resistor layer. In particular, a tantalum island 1510 overlies a metal layer 1520 that overlies a resistor layer 1530. The tantalum island 1510 is conductively coupled to the lower metal layer 1520. This permits a large and low-resistance contact area for an ESD event. The shunt bar 1540 is connected to an ESD protection device (not shown).

The foregoing description of the preferred embodiments of the invention has been presented for the purposes of illustration and description. It is not intended to be exhaustive or to limit the invention to the precise form disclosed. Accordingly, the foregoing description should be regarded as illustrative rather than restrictive, and it should be appreciated that variations may be made in the embodiments described by workers skilled in the art without departing from the scope of the present invention as defined by the following claims.

What is claimed is:

1. A substrate comprising an electrically-inactive substrate feature intergrated with and surrounded by a plurality of shielding layers that are capacitively coupled to and together with a shunt bar that shunts an electrostatic discharge event through a preferred path away from the electrically-inactive substrate feature.

2. The invention as set forth in claim 1, wherein the electrically-inactive substrate feature is coupled to a plurality of thin film layers.

3. The invention as set forth in claim 2, wherein the thin film layers include a protection layer made of Tantalum.

4. The invention as set forth in claim 1, wherein the electrically-inactive substrate feature is a mechanical feature without any electrical functions.

5. The invention as set forth in claim 1, wherein the electrically-inactive substrate feature without any electrical functions has been etched into the substrate.

6. A microsystem comprising an electrically-inactive component integrated and surrounded by a plurality of shielding layers that are capacitively coupled to and together with a shunt bar that shunts an electronic discharge event through a preferred path away from the electrically-inactive component.

7. The invention as set forth in claim 6, wherein the electrically-inactive component is coupled to a thin-film device.

8. The invention as set forth in claim 7, wherein the thin-film device is a thin-film layer.

9. The invention as set forth in claim 6, wherein the electrically-inactive component is a mechanical feature without any electrical functions.

10. The invention as set forth in claim 9, wherein the microsystem further comprises a substrate and the mechanical feature without any electrical functions is etched into the substrate.

11. A microsystem comprising, an electrically-inactive component;

plural conductive shields integrated with and surrounding the electrically-inactive feature; and a shunt bar coupled to the plural conductive shields that capacitively couples the conductive shields together and provides a preferred path for an electrostatic discharge event, the preferred path being away from the electrically-inactive component.

12. The invention as set forth in claim 11, wherein the elecrically-inactive component is coupled to a thin-film apparatus.

13. The invention as set forth in claim 12, wherein the thin-film apparatus further comprises:

a resistor layer that provides a heat source;

a dielectric layer overlying the resistor layer that electrically insulates the resistor layer; and a protection layer overlying the dielectric layer that protects a protection for the dielectric and the resistor layers.

14. The invention as set forth in claim 13, wherein the preferred path for the electrostatic discharge event is at least partially along the protection layer.

15. A method of protecting a microsystem having an electrically-inactive component from an electrostatic discharge event, comprising:

surrounding the electrically-inactive component with an electrostatic discharge protection system having shield layers coupled to a shunt bar, the protection system being integrated with the electrically-inactive component of the microsystem and located between the electrically-inactive component and a location where the electrostatic discharge event occurs;

capacitively coupling together the shield layers of the protection system with the shunt bar; and shunting the electrostatic discharge event through a preferred path away from the electrically-inactive component with the shunt bar.

16. The invention as set forth in claim 15, wherein the electrically-inactive component is a mechanical feature without any electrical functions.

17. The invention as set forth in claim 15, wherein the electrically-inactive component is coupled to a thin-film device.

18. The invention as set forth in claim 17, wherein the thin-film device further comprises:

a resistor layer for heating;

a dielectric layer for electrically insulating the resistor layer; and a protection layer for protecting the dielectric and the resistor layers.

19. The invention as set forth in claim 18, wherein the electrostatic discharge event is routed at least partially through the protection layer.

20. A method of protecting a substrate having an electrically-inactive substrate feature from an electrostatic discharge event, comprising:

integrating and surrounding the electrically-inactive component with an electrostatic discharge protection system having shield layers coupled to a shunt bar;

capacitively coupling together the shield layers of the electrostatic discharge protection system with the shunt bar;

positioning the electrostatic discharge protection system between a location where the electrostatic event occurs and the electrically-inactive feature; and shunting the electrostatic discharge event through a preferred path away from the electrically-inactive component with the shunt bar.

21. The invention as set forth in claim 20, wherein the preferred path is away from the electrically-inactive substrate feature.

22. The invention as set forth in claim 21, wherein the electrically-inactive substrate feature is a mechanical feature without any electrical functions.

23. The invention as set forth in claim 21, wherein the electrically-inactive substrate feature contains a plurality of thin-film layers.

24. The invention as set forth in claim 23, wherein the preferred path is through at least one of the plurality of thin-film layers.

* * * * *